United States Patent [19]

Kenworthy

[11] 4,223,321
[45] Sep. 16, 1980

[54] PLANAR-FACED ELECTRODE FOR INK JET PRINTER AND METHOD OF MANUFACTURE

[75] Inventor: E. J. Doyle Kenworthy, Dayton, Ohio

[73] Assignee: The Mead Corporation, Dayton, Ohio

[21] Appl. No.: 34,710

[22] Filed: Apr. 30, 1979

[51] Int. Cl.² ............................................. G01D 15/18
[52] U.S. Cl. ........................................ 346/75; 29/846
[58] Field of Search .................... 346/75; 29/592, 624, 29/625

[56] References Cited

U.S. PATENT DOCUMENTS

| | | | |
|---|---|---|---|
| 3,604,980 | 9/1971 | Robertson | 346/75 X |
| 3,618,858 | 11/1971 | Culp | 346/75 X |
| 3,656,171 | 4/1972 | Robertson | 346/75 X |
| 3,852,877 | 12/1974 | Ahn | 29/625 |
| 3,975,741 | 8/1976 | Solyst | 346/75 |
| 4,101,906 | 7/1978 | Dahlstrom | 346/75 |

OTHER PUBLICATIONS

Pederson, K. A.; Ink Jet Charge Plate; IBM Tech. Disc. Bulletin, vol. 19, No. 2, Jul. 1976, p. 673.
Hoekstra et al.; Fabrication of Slotted Charge Structures...; IBM Tech. Disc. Bulletin, vol. 19, No. 4, Sep. 1976, pp. 1471-1472.
Olsen, C. E.; Passivation for Ink Jet Charge Plates; IBM Tech. Disc. Bulletin, vol. 20, No. 3, Aug. 1977, p. 1192.
Nickols et al.; Ink Jet Charge Plate Fabrication; IBM Tech. Disc. Bulletin; vol. 20, No. 5, Oct. 1977, pp. 1939-1940.

Primary Examiner—Joseph W. Hartary
Attorney, Agent, or Firm—Biebel, French & Nauman

[57] ABSTRACT

A planar charge plate having individual charge electrodes uniformly spaced along one face thereof is provided by cutting grooves into the edge of a blank nonconductive charge plate support structure. The surfaces of the structure, including grooves and lands, are metallized and printed circuit leads are formed leading from the grooves. The grooves are filled with an electrically conductive material such as solder, and then the front face of the structure is lapped to remove excess solder and metal plating from the lands to form the completed planar-faced structure.

10 Claims, 4 Drawing Figures

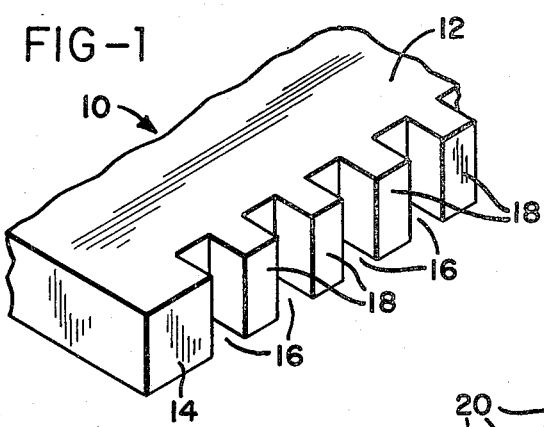
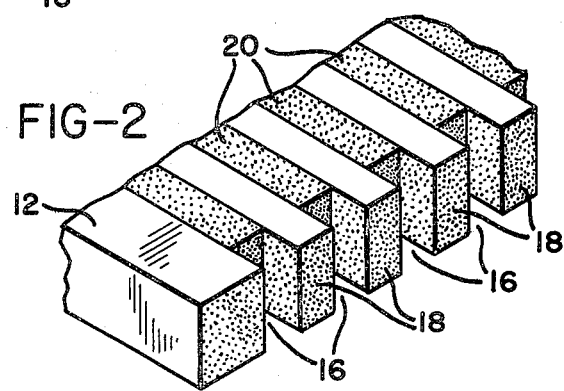
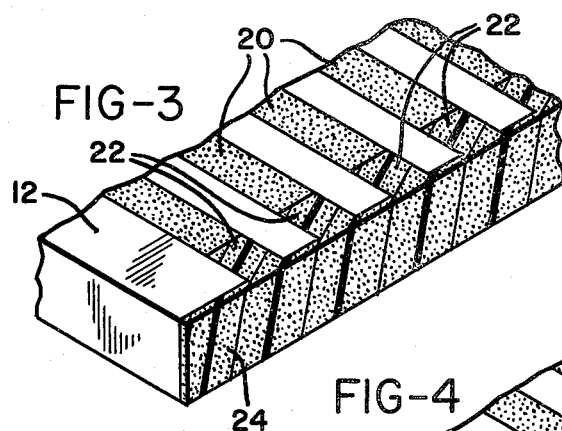
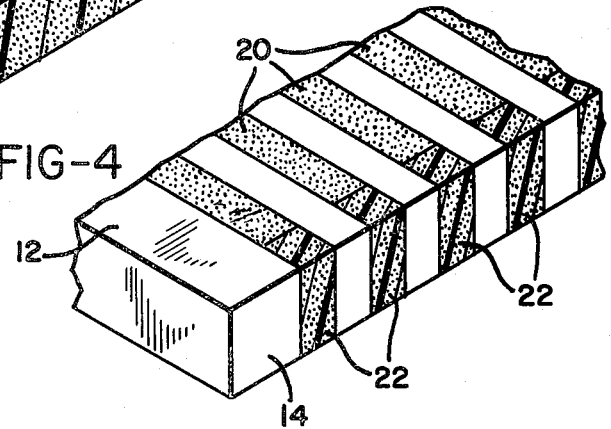

PLANAR-FACED ELECTRODE FOR INK JET PRINTER AND METHOD OF MANUFACTURE

BACKGROUND OF THE INVENTION

This invention relates generally to ink jet printing systems, and more particularly to a charge plate and method of fabrication of a charge plate for use in an ink jet printing system.

In ink jet printers, such as the systems shown by Sweet et al, U.S. Pat. No. 3,373,437, which print on a moving web with uncharged ink drops while deflecting and catching charged drops, charge electrodes have performed the critical function of selectively charging the ink drops. The drops of ink are formed from fluid filaments which emerge from small orifices in an orifice plate communicating with an ink fluid reservoir in which electrically conductive ink is maintained under pressure. By mechanically stimulating the orifice plate, the fluid filaments are caused to break up into uniformly sized and spaced drops. As each drop breaks off from a fluid filament it is selectively charged or left uncharged in a predetermined pattern by an associated charge electrode. The drops then pass through an electrostatic deflection field with the charged drops being deflected thereby to a drop catcher. The uncharged drops remain undeflected and continue past the deflection field to impact on a moving print web in a human readable pattern.

Charge electrodes previously used in the art have comprised an electrically conductive material coated onto a nonconductive substrate. They have partially or wholly surrounded the corresponding ink jet stream and extended uniformly along the stream for a distance of at least several drop diameters. Because of the tendency of the ink drops to break off from the filaments at different points, the electric field produced by the charge electrode must be uniform along the length of the ink filaments so that drops may be properly charged with regard to their exact breakoff point. Early patents to Loughren, U.S. Pat. No. 3,404,221, and Sweet et al, U.S. Pat. No. 3,373,437, utilized cylindrically shaped hollow rings or tubes or U-shaped channels as charge electrodes. However, the accurate placement of the tubes or channels into a support structure and then electrically connecting such devices to a signal source was both difficult and time consuming, especially in multi-jet systems utilizing hundreds of individual streams of ink drops spaced only a few thousandths of an inch apart.

Several workers in the art have attempted to reduce the difficulty and expense of forming charge electrodes. For example, Beam et al, U.S. Pat. No. 3,586,907, shows a charge ring plate with a series of holes therein and having a coating of an electrically conductive material surrounding each hole and extending along the walls of the hole forming charge electrodes. Electrical lead lines are also plated onto the surface of the charge plate and extend from each charge ring to a connection point. The techniques involved in plating the walls of the holes to obtain a continuous and uniform coating are complex and involve plating in several dimensions. Likewise, coating the U-shaped channels shown in Culp, U.S. Pat. No. 3,618,858, with an electrically conductive material also involves plating in several dimensions.

Another example of forming charge electrodes is shown by Robertson, U.S. Pat. Nos. 3,604,980 and 3,656,171, in which a dielectric planar surface has plated thereon a series of strips of electrically conductive material, each connected to a charging signal source. Robertson differs from other prior art charge electrodes in that the conductive strips do not surround or partially surround the drop streams. However, the formation of the conductive strips still involves plating in several dimensions.

Accordingly, the need still exists in the art for a relatively simple method for forming a multiplicity of uniformly spaced and coated charge electrodes on a charge plate.

SUMMARY OF THE INVENTION

In accordance with the present invention, a planar charge plate having charge electrodes uniformly spaced along one face thereof is fabricated by initially cutting grooves into the edges of a blank charge plate support structure. The blank structure may be of any suitable dielectric material including fiberglass laminates, molded polymeric resins, or machinable glass ceramics and are shaped to have at least one planar vertical edge. The surfaces of the cut support structures are then plated with a conductive metal such as titanium and/or nickel using techniques well-known in the art.

In a preferred embodiment, a layer of photoresist material is then applied to the upper surface of the charge support structure. The upper surface is then masked and exposed with light to develop the photoresist material. The areas on the upper surface of the support structure corresponding to the positioning of electrical lead lines will remain protected once the excess photoresist is washed away. A masking material is then applied to the face and grooves to protect them. The exposed areas on the upper surface of the structure are then chemically etched to remove the exposed plated metal.

The photoresist and masking material covering the electrical lead lines and face is then stripped away leaving a structure with conductive lead lines on the upper surface and conductive grooves that are interconnected across the face of the lands on the front face of the charge support structure. A bead of melted solder can now be run across the face of the structure, filling in the grooves and bridging across the lands. The solder may be applied using a low temperature soldering iron heated above the melting point of the solder. The liquid solder will be drawn in to fill the grooves by capillary action. Alternatively, a conductive epoxy resin or electroless plating techniques may be used to fill in the grooves with an electrically conductive material.

Finally, the face of the charge plate support structure is lapped, removing the excess solder or other conductive material and the plated metal layer on the lands. The result is a planar charge plate having uniformly shaped and spaced charge electrodes. The conductive lead lines are already electrically connected to the individual charge electrodes by way of the metal plating-solder interface in the grooves. This planar charge electrode structure is particularly useful when placed in an ink jet printer of the type disclosed in Spyrou et al, U.S. Ser. No. 970,473, filed Dec. 18, 1978.

Accordingly, it is an object of the present invention to provide an electrode charge plate structure and method of manufacture for use in an ink jet printing head which is simple to fabricate, yet provides uniformly sized and spaced charge electrodes without resort to complex plating techniques. This and other objects and advantages of the invention will become apparent from the following description, the accompanying drawings, and the appended claims.

BRIEF DESCRIPTION OF THE DRAWINGS

FIG. 1 is a perspective view of a blank charge electrode support structure with grooves cut into one face thereof;

FIG. 2 is a perspective view of a partially completed charge plate structure having electrically conductive leads deposited on the upper surface, face, and grooves thereof;

FIG. 3 is a perspective view of a partially completed charge plate structure with electrically conductive material filling the grooves on the face of the charge plate and extending onto the land areas thereof; and FIG. 4 is a perspective view of a completed planar charge plate structure in accordance with this invention.

DESCRIPTION OF THE PREFERRED EMBODIMENTS

Referring now to FIG. 1, an electrically nonconductive charge plate support structure 10 having an upper surface 12 and at least one planar face 14 has a plurality of regularly spaced grooves 16 cut therein. Preferably face 14, with lands 18 is perpendicular to upper surface 12. When positioned in an ink jet printing head, the surface of face 14 will be positioned parallel to the direction of flow of the streams of ink drops.

Support structure 10 may be fabricated of any suitable nonconductive material such as machinable glass ceramics, fiberglass laminates, molded polymeric resins, or the like. An example of a suitable substrate material is Fotoceram, a glass ceramic material available from Corning Glass Works, Corning, New York. Grooves are cut into support structure 10 by a saw blade or any other suitable technique known in the art. The width of the grooves, as well as their spacing, may vary depending upon the resolution requirements of the particular jet printing system in which the finished charge plate is to be installed. For example, in a printer using jet drop streams on 0.004 inch centers, the grooves should be approximately 0.002 inches wide, 0.003 inches in depth, and spaced on the same 0.004 inch centers.

After the grooves have been cut into face 14, at least the upper surface 12, walls of grooves 16, and lands 18 are metallized by plating using known techniques. A preferred plating method is ion plating with titanium, nickel, or mixtures or alloys of the two metals until a suitable thickness, from about several hundred to 2000 angstroms, is built up.

Following plating, a negative photoresist material such as a dry film photoresist is applied to upper surface 12. A mask is placed over the upper surface 12 of support structure 10, leaving exposed those regions corresponding to the placement of electrical lead lines and shown as areas 20 in FIG. 2. The support structure 10 is then exposed to a source of light which polymerizes and cross-links the photoresist in the exposed areas. Unexposed photoresist is then washed away, and a masking material is applied to the grooves and land areas on the face of the structure. The support structure 10 is then subjected to a conventional chemical etching procedure which removes the metal plating from all areas unprotected by the photoresist coating. After etching, the support structure is rinsed and the photoresist and masking material stripped away leaving the structure illustrated in FIG. 2 having electrical lead lines 20 extending across upper surface 12 from each individual groove 16. Alternatively, an additive plating process may be used using a negative photoresist. The upper surface 12 of support structure 10 is coated with the photoresist, and the electrical lead circuitry is exposed through a positive working mask. The entire piece including grooves 16 and lands 18 are then metal plated. The photoresist in the areas not corresponding to the electrical leads is then removed, removing with it excess metal plating material leaving a structure as illustrated in FIG. 2.

Grooves 16 are now filled with an electrically conductive material such as a low temperature melting solder, a conductive epoxy resin, electroless nickel, or the like to form charge electrodes 22. A preferred method of filling grooves 16 is to heat support structure 10 to approximately 300° F. and apply soldering flux to the groove area. Using a low temperature soldering iron, a bead of a lead-tin alloy solder is run across face 14 of support structure 10. The liquid solder is drawn into grooves 16 by capillary action and fills them. Excess solder will bridge across the face 14 of support structure 10 as shown in FIG. 3. After the structure is cooled and the solder hardened, face 14 of support structure 10 is lapped to remove excess solder and the metal plating on lands 18 to yield a finished charge plate structure as illustrated in FIG. 4.

It is also within the scope of this invention to omit the formation of electrical leads plated onto the upper surface of the support structure and instead attach flexible electrical leads directly to the individual charge electrodes. In this embodiment, flexible printed circuit leads encapsulated in a polymeric film, such as a polyimide film available from E. I. duPont DeNemours and Co. under the trademark Kapton, are attached by suitable hand-soldering techniques to the individual charge electrodes.

While the methods and apparatus herein described constitute preferred embodiments of the invention, it is to be understood that the invention is not limited to these precise methods and apparatus, and that changes may be made in either without departing from the scope of the invention, which is defined in the appended claims.

What is claimed is:

1. A planar-faced charge electrode structure comprising,
   an electrically nonconductive substrate having a plurality of regularly spaced grooves and lands on one face thereof,
   a first electrically conductive material plated in said grooves and extending therefrom across the upper surface of said substrate to form electrical lead means, and
   a second electrically conductive material filling said grooves and extending flush with the surface of said lands forming a planar face therewith.

2. The electrode structure of claim 1 where said first electrically conductive material is selected from the group consisting of titanium, nickel, and mixtures and alloys thereof.

3. The electrode structure of claim 2 where said second electrically conductive material is selected from the group consisting of a tin-lead alloy solder, silver containing epoxy resin, and electroless nickel.

4. The electrode structure of claim 1 where said grooves are 0.002 inches wide, 0.003 inches deep, and are spaced on 0.004 inch centers.

5. A method of fabricating a planar-faced charge electrode structure comprising the steps of:
 (a) cutting a plurality of regularly spaced grooves in one face of a blank, electrically nonconductive support structure,
 (b) plating said grooves and the lands on the face of said support structure with a first electrically conductive material,
 (c) filling said grooves with a second electrically conductive material, and
 (d) lapping the face of said support structure to remove excess first and second electrically conductive materials and thereby forming a planar-faced structure having a plurality of uniformly sized and spaced charge electrodes thereon.

6. The method of claim 5 including prior to step (c) the steps of,
 plating the upper surface of said support structure with said first electrically conductive material, and
 selectively etching away portions of said first electrically conductive material to produce electrical leads extending from the upper edge of each respective groove across the upper surface of said support structure.

7. The method of claim 5 where said first conductive material is selected from the group consisting of titanium, nickel, and mixtures and alloys thereof.

8. The method of claim 7 where said second conductive material is selected from the group consisting of a tin-lead alloy solder, a silver containing epoxy resin, and electroless nickel.

9. The method of claim 8 where said grooves are cut by a saw.

10. The method of claim 7 where said second conductive material is a tin-lead alloy solder which is melted and drawn into said grooves by capillary action.

* * * * *